United States Patent [19]

Chan

[11] Patent Number: 5,719,509

[45] Date of Patent: Feb. 17, 1998

[54] METHOD OF CONTROLLING TRANSMISSION OF BINARY PULSES ON A TRANSMISSION LINE

[75] Inventor: Francis H. Chan, Williston, Vt.

[73] Assignee: International Business Machines Corporation, Armonk, N.Y.

[21] Appl. No.: 461,483

[22] Filed: Jun. 5, 1995

Related U.S. Application Data

[62] Division of Ser. No. 312,731, Sep. 27, 1994, Pat. No. 5,486,782.

[51] Int. Cl.$^6$ .................................................. H03K 3/00
[52] U.S. Cl. ........................ 327/112; 327/391; 327/437; 326/87; 326/27
[58] Field of Search ........................ 327/108, 109, 327/110, 111, 112, 374, 375, 376, 377, 170, 391, 437, 380; 326/21–27, 87

[56] References Cited

U.S. PATENT DOCUMENTS

| | | | |
|---|---|---|---|
| 4,421,994 | 12/1983 | Puri et al. | 327/111 |
| 4,477,741 | 10/1984 | Moser, Jr. | 326/57 |
| 4,638,187 | 1/1987 | Boler et al. | 326/27 |
| 4,680,487 | 7/1987 | Kobayashi | 326/87 |
| 4,682,050 | 7/1987 | Beranger et al. | 326/26 |
| 4,719,369 | 1/1988 | Asano et al. | 326/30 |
| 4,731,553 | 3/1988 | Van Lehn et al. | 326/87 |
| 4,739,198 | 4/1988 | Maruyama | 327/52 |
| 4,779,013 | 10/1988 | Tanaka | 326/27 |
| 4,829,199 | 5/1989 | Prater | 326/87 |
| 4,952,818 | 8/1990 | Erdelyi et al. | 327/108 |
| 4,961,010 | 10/1990 | Davis | 326/27 |
| 4,992,677 | 2/1991 | Ishibashi et al. | 326/27 |
| 5,015,880 | 5/1991 | Drake et al. | 326/87 |
| 5,034,637 | 7/1991 | Jungert | 327/310 |
| 5,055,713 | 10/1991 | Watanabe et al. | 326/27 |
| 5,057,711 | 10/1991 | Lee et al. | 326/87 |
| 5,089,724 | 2/1992 | Chuang et al. | 326/124 |
| 5,120,992 | 6/1992 | Miller et al. | 327/111 |
| 5,122,690 | 6/1992 | Bianchi | 326/87 |
| 5,134,311 | 7/1992 | Biber et al. | 327/108 |
| 5,166,555 | 11/1992 | Kano | 326/87 |
| 5,285,116 | 2/1994 | Thaik | 326/21 |
| 5,296,757 | 3/1994 | Koizumi | 326/21 |
| 5,319,258 | 6/1994 | Ruetz | 327/108 |
| 5,323,420 | 6/1994 | Asprey | 327/78 |
| 5,352,939 | 10/1994 | Hirabayashi et al. | 327/108 |
| 5,381,055 | 1/1995 | Lai et al. | 327/108 |
| 5,410,189 | 4/1995 | Nguyen | 327/374 |
| 5,426,376 | 6/1995 | Wong et al. | 326/27 |
| 5,486,782 | 1/1996 | Chan | 327/374 |
| 5,493,232 | 2/1996 | Kube | 326/27 |
| 5,517,129 | 5/1996 | Matsui | 326/27 |
| 5,537,060 | 7/1996 | Baek | 326/87 |

*Primary Examiner*—Tumothy P. Callahan
*Assistant Examiner*—Kenneth B. Wells
*Attorney, Agent, or Firm*—Lynn L. Augspurger

[57] ABSTRACT

A push-pull output driver includes a pair of auxiliary, low current capacity output circuits connected in parallel with a pair of high current capacity, series connected devices. In response to a pulse transition at the input of the driver circuit, one of the high current capacity devices is turned on to provide the current necessary for a change in state of the output signal. After the output signal has reached a steady state level, the associated auxiliary low current capacity device is turned on and the high current capacity device is turned off. For the remainder of the duration of the pulse, the relatively low current required to maintain the output signal is provided by the auxiliary gate. At the next pulse transition, the other of the high current capacity gates is turned on. Since the first high current capacity gate was turned off prior to the pulse transition, only one of the high current capacity devices is drawing current from the supply and the need for a large current supply is eliminated. The circuit of the invention allows for the design of very high speed drivers and the totem pole currents which are the source of Delta-I noise do not occur. The driver includes a pulse circuit responsive to voltage levels of the driver output terminals to selectively turn off the primary, high current carrying capacity gates and to selectively turn on and off the auxiliary gates.

5 Claims, 2 Drawing Sheets

METHOD OF CONTROLLING TRANSMISSION OF BINARY PULSES ON A TRANSMISSION LINE

This is a division, of application Ser. No. 08/312,731 filed Sep. 27, 1994, now U.S. Pat. No. 5,486,782.

BACKGROUND OF THE INVENTION

1. Field of the Invention

This invention relates to low-noise, high-speed output drivers and, more particularly, to a push-pull driver for the transmission of binary signals on a transmission line.

2. Background Art

Basic operation of high-speed data processing systems requires high-speed logic circuitry to perform complex logic operations in the shortest possible time. Additionally, data in the form of electrical pulses must be transmitted between circuits, such as memory devices and logic circuits, at a high rate of speed over conductors. Because of the high data rates, the conductors exhibit characteristics of transmission lines even though the conductors may be only inches in length, as, for example, between integrated circuit chips of a multi-chip module.

A characteristic of a transmission line is that a relatively large amount of current is required to effect a rapid change from a high voltage to a low voltage state and vice versa. The rapid change is particularly important where digital signals represented by voltage level changes are transmitted between circuits. MOS logic circuits are commonly used in present day high-speed computers and large capacity complementary MOS transistors are used to supply the current to charge and discharge transmission lines. The devices are typically connected in series between terminals of a power supply, with the output of the driver taken from the node at which the devices are interconnected. That arrangement is often referred to as a push-pull driver. A problem with a circuit of that type is that the large current capacity transistors connected to a transmission line require a significant period of time to turn off and on. For high-speed operations, it's desirable to switch the transistors as quickly as possible. Preferably, they are switched simultaneously, i.e. by turning on one transistor while turning off the other transistor. However, this requires a large current supply to drive. Furthermore, the simultaneous operation of the two switches also results in current spikes, referred to in "totem pole" currents, which cause so-called Delta-I noise. The Delta-I noise may cause extraneous signals which result in computation errors, degrading system performance.

Various attempts have been made to reduce the current spikes which produce the undesirable Delta-I noise. For example, U.S. Pat. 4,719,369 describes a CMOS output circuit which is adapted to adjust the driver's output impedance to match that of the transmission line. This arrangement is intended to minimize the variations of output swing and, hence, the current pulses. However, this arrangement requires separate width control circuitry and cannot be effectively used to eliminate totem-pole current if a fast driver design is desired. U.S. Pat. 4,961,010 describes an arrangement for reducing the undesirable noise spikes in a push-pull driver by partitioning of the output devices to allow the switches to be operated in sequence rather than simultaneously. However, this defeats the purpose of the high-speed circuit design, in that a delay is intentionally introduced. That circuit does not allow for a fast driver operating at speeds compatible with high-speed logic circuitry.

SUMMARY OF THE INVENTION

These and other problems of the prior art are overcome in accordance with the principles of this invention by means of a pair of primary, high capacity current drivers which are turned on when the high current capacity is required, i.e. at pulse transitions, and a corresponding pair of auxiliary low current capacity drivers, connected in parallel with the high current capacity drivers, maintain the logic state of the pulse. After a pulse transition, produced by operation of one of the primary, high current capacity devices, the primary device is turned off and the current necessary to maintain the pulse is provided by the associated auxiliary low current capacity device. Advantageously, prior to a next pulse transition, both of the large current capacity devices are in the off state and at the next pulse transition only the one of the large current capacity devices to be turned on will draw current. Consequently, the overlapping current demand occurring in prior art circuits where current is drawn simultaneously by the device being turned off, as well as the-device being turned on, is eliminated. Furthermore, the large totem pole current spikes, typically resulting from the simultaneous switching by two high current capacity devices, are not generated. Advantageously, the arrangement of this invention allows for the design of very high speed drivers.

In accordance with one aspect of the invention, circuitry is provided to turn off a high current capacity primary device and to turn on an auxiliary device a period of time after the primary device has been turned on in response to an input signal. The delay period between the time that a primary device is turned on and the time that it is turned off is preferably of sufficient duration to charge the transmission line, i.e. to assure that a proper signal has been received at the receiving end of the transmission line. In one specific embodiment of the invention, a trigger circuit, responsive to a reflected wave reflected from the receiving end of the transmission line, initiates a pulse, which turns on the low auxiliary device and turns off the primary device. In accordance with one particular aspect of the invention, the output impedance of the driver matches the characteristic impedance of the transmission line to improve pulse transmission. Advantageously, the arrangement of the present invention reduces power consumption and Delta-I noise without sacrificing speed of operation.

BRIEF DESCRIPTION OF THE DRAWING

The embodiment of the invention is described below with reference to the drawing in which.

DETAILED DESCRIPTION

Figure 1:
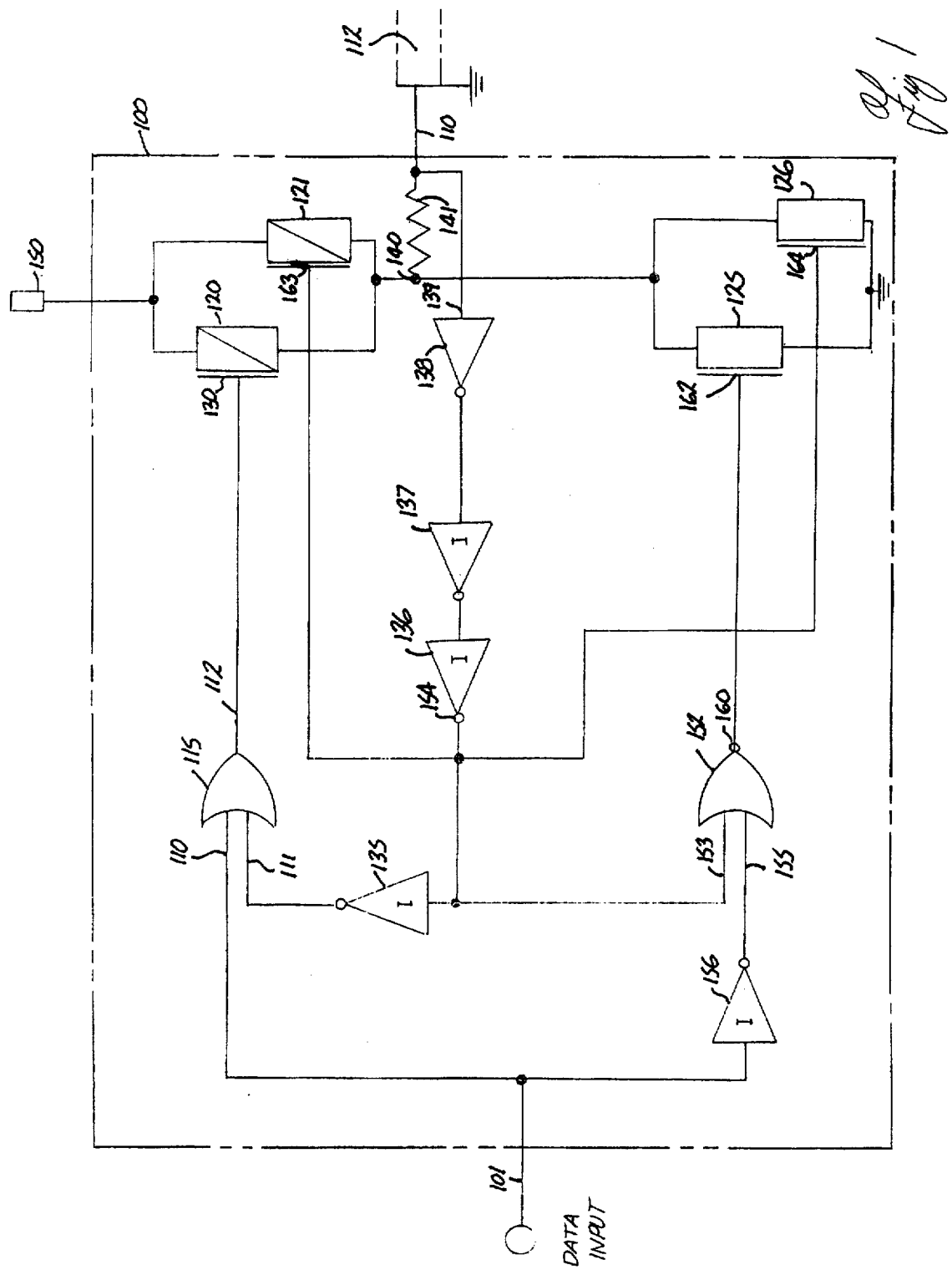
FIG. 1 is a diagrammatic representation of a CMOS output driver circuit incorporating principles of the invention.

FIG. 1 is a circuit diagram representation of a CMOS push-pull driver 100 incorporating principles of the invention. The driver circuit has an input terminal 101 from which it receives pulsed data input signals and an output 110 for connection to a transmission line 112. The particular implementation shown in FIG. 1 is an out-of-phase driver circuit in which a phase reversal takes place between the input and output. By way of example, a positive going data input pulse on input 101 will result in a negative going pulse on the output 110. The circuit may be readily converted to an in-phase driver by inverting the input in a standard fashion.

In that case, a positive going input data pulse would result in a positive going output pulse on output 110. The operation of the circuit remains the same for in-phase and out-of-phase configurations. The latter is described herein.

The illustrative embodiment described below employs P-channel MOS gates referred to as PFETs and N-channel MOS gates referred to as NFETs. The circuit of FIG. 1 comprises complementary PFET and NFET gates 120 and 125 and complementary PFET and NFET MOS gates 121 and 126. When a low logic state signal is applied to the gate input 130 of PFET 120, this gate will conduct providing a high amplitude current from a current source 150 to node 140 and via resistor 141 to the transmission line via output terminal 110. The current capacity of PFET 120 is sufficiently great to charge the transmission line and may, for example, be on the order of 100 milliamps. In the circuit of FIG. 1, a resistor 141 is connected between the node 140 and the output terminal 110. This resistor has a value which, when taken together with the internal resistance of PFET 120, is approximately equal to the characteristic impedance of the transmission line 112 connected to output terminal 110. In one particular embodiment of the invention, the circuit is designed to be connected to a transmission line having a characteristic impedance of 50 ohms and the value of the resistor 141 is chosen such that the internal resistance of the PFET 120 together with the resistor 141 provides an impedance of 50 ohms. The PFET 120 and the NFET 125 preferably have substantially identical internal resistance to facilitate matching the transmission line impedance. These devices may also be designed to have a particularly desired internal impedance (e.g., 50 ohms) such that the resistor 141 is not required.

When a high logic state signal is applied to gate input 162 of NFET 125, this gate will conduct current from the transmission line 112 to ground through the resistor 141, thus terminating a positive signal on the transmission line. The current capacity of NFET 125, like that of PFET 120, may be on the order of 100 milliamps. The PFET 121 is connected in parallel with the PFET 120 and also performs the function of providing current from the source 150 to the output terminal 110. Similarly, the NFET 126 is connected in parallel with NFET 125 and serves to provide a connection from the output terminal 110 to ground. The current carrying capacities of PFET 121 and NFET 126 are much smaller than the current carrying capacity of PFET 120 and NFET 125 and may be on the order of microamperes.

OR-gate 115 has an input terminal 104 connected to data input 101 and another input 111 connected via inverters 135, 136 and 137 to a Schmitt trigger 138 which has an input terminal 139 connected to output 110. The output 106 of OR-gate 115 is connected to the gate input 130 of PFET 120. A NOR gate 152 has an input terminal 153 connected to an output terminal 154 of inverter 136. Input terminal 155 of NOR-gate 152 is connected via invertor 156 to the data input 101. The output 160 of NOR-gate 152 is connected to gate input 162 of NFET 125. Further, the output 154 of inverter 136 is also connected to gate terminal 163 of PFET 121 and gate terminal 164 of PFET 126.

Figure 2:
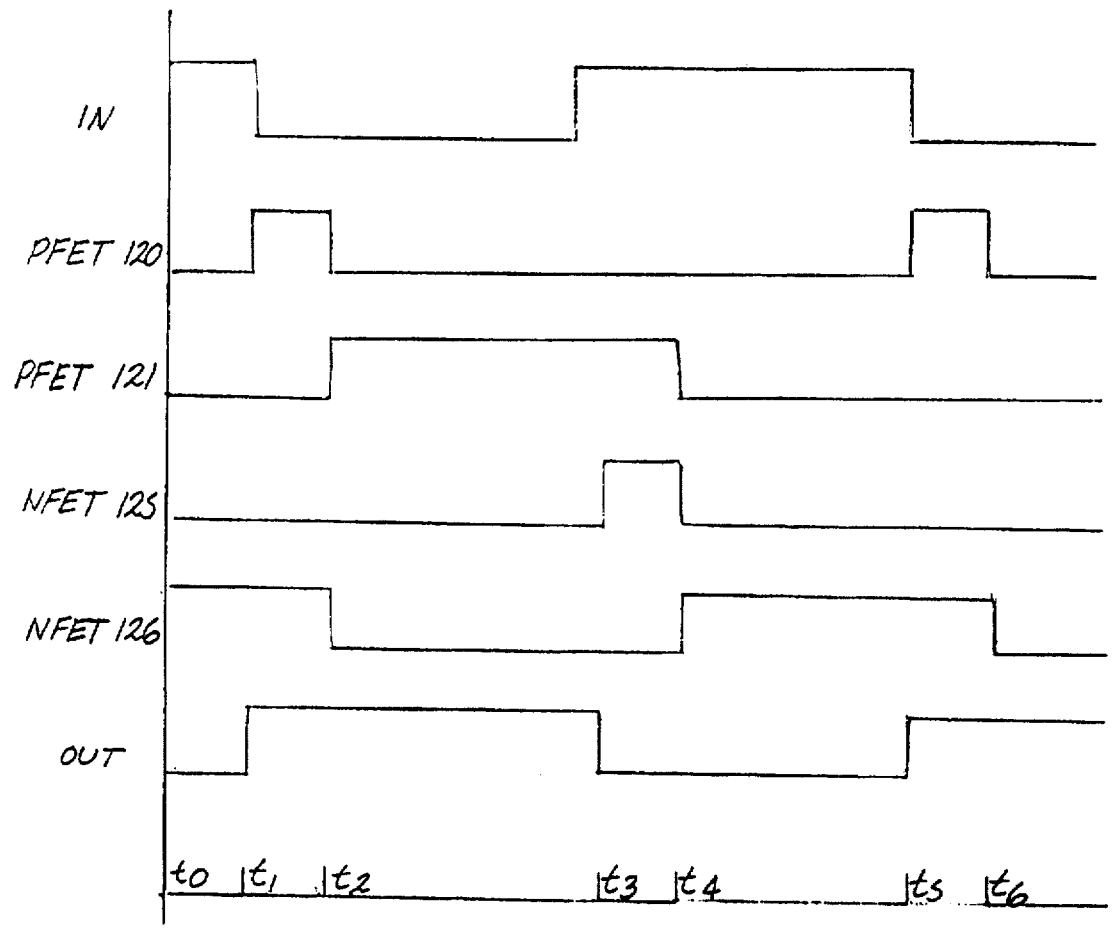
FIG. 2 is a timing diagram showing relative timing of actions occurring within the circuit of FIG. 1.

In order to illustrate the operation of the circuit of FIG. 1, reference is made to the timing diagram of FIG. 2 which represents occurrences of various actions within circuit 100. It is assumed, that at time t0 a positive pulse is present on the data input 101 represented by IN in FIG. 2. Accordingly, output 110 is at a low logic level. Furthermore, PFETs 120 and 121 and NFET 125 are turned off and NFET 126 is turned on. At time t1, the pulse on data input 101 terminates. As a result, by operation of OR gate 115, a low logic level signal is applied to gate input 130 of PFET 120. Thus, this transistor is turned on as indicated in FIG. 2. Furthermore, by operation of inverter 156 and NOR gate 152, a low logic level signal is applied to gate input 162 of NFET 125. However, no state change results in NFET 125 since that transistor was turned off at t0, as indicated in FIG. 2. Due to the operation of PFET 120, a positive output pulse is produced on output 110. It will be understood that when output 110 is connected to a transmission line 112, the state of the transmission line does not abruptly change from a low state to a high state. Time is required for the transmission line to charge and at least one reflected wave can be expected to travel from the receiving end of the transmission line back to the transmit end at output 110. Such transients on the transmission line are not intended to be reflected by the graphical representation of FIG. 2. Rather, FIG. 2 is intended to illustrate the timing of logic changes and operation of the switches.

The Schmitt trigger 138 is a well-known and commercially available device which is adjustable to a selected voltage threshold to be turned on and a lower threshold to be turned off. In this particular embodiment, the circuit 138 is adjusted to such a turn-on voltage level that the initial signal occurring when PFET 120 is first turned on will not activate the circuit and such that the circuit will be activated when the voltage level on the transmission line is raised due to the return of the reflected wave. Due to impedance matching of the output circuit 100 to the transmission line 112, the transmission line will be essentially fully charged and a stable signal will have been received at the receiving end when the reflected wave reaches the Schmitt trigger 138. An output signal generated by the Schmitt trigger 138 is further delayed by inverters 136 and 137, and a low logic level signal is eventually applied to the gate input 163 of PFET 121. Consequently, this device will be turned on providing a low amplitude current to the transmission line to maintain the transmitted pulse at the desired level. After two further gate delays, introduced by invertor 135 and OR-gate 115, the large current capacity transistor PFET 120 is turned off. Additionally, the signal generated at output 154 of inverter 136, which is a low logic level signal, is also applied to gate input 164 of NFET 126. Accordingly, this device is turned off. The actions of turning off PFET 120 and NFET 126 and the turning on of PFET 121 are shown in FIG. 2 to occur at time t2. It will be noted that there is a period of overlap between PFET 120 and NFET 126 such that a certain amount of current is drained from the node 140 by NFET 126 while the PFET 120 is conducting current to node 140. Since the magnitude of current supplied by PFET 120 is much greater than that being conducted away from the node 140 by NFET 126, this overlap does not significantly affect operation of the circuit or increase Delta-I noise. If desired, logic circuitry could be readily designed to turn off the NFET 126 at the time that the PFET 120 is turned on and before the Schmitt trigger is activated.

Referring again to FIG. 2, a pulse transition is shown to occur on input 101 at time t3. Since this is a positive going pulse, NFET 125 will be turned on through operation of inverter 156 and NOR-gate 152 draining current from node 140. It should be noted that since the large current capacity PFET 120 was turned off at time t2, the two large current capacity gates are not drawing current simultaneously. Thus, the excessive drain on the current supply and large current spikes present in the simultaneously switching prior art circuits are eliminated. Furthermore, there is no significant delay introduced between the time that the input signal changes to the time that the discharge NFET 125 is activated, thereby avoiding the delay often introduced in prior art gates and allowing higher data rates.

The Schmitt trigger 138 is adjusted such that it produces an output signal until its input drops below a predetermined voltage level. In the illustrative example of FIG. 2, this occurs at time 14. As a consequence, the trigger 138 will produce a high logic level output signal. This causes the low current capacity NFET 126 to be turned on and the low current capacity PFET 121 to be turned off. Further, the high current capacity NFET 125 is turned off through operation of NOR-gate 152. The changes shown in FIG. 2 at times 15 and 16 are identical to those occurring at t1 and t2 and are shown to indicate the repetitive nature of the operation. The delay introduced by inverters 135, 136 may be adjusted such as to assure that reflections on the transmission have settled before the large current capacity device is shut off.

What is claimed is:

1. A method of controlling transmission of binary pulses in a driver circuit connected to a sending end of a transmission line, the method comprising the steps of:

receiving a binary input signal of a first logic level in the driver circuit;

in response to the receipt of the binary input signal, turning on a first primary gate circuit connected to the sending end of the transmission line to provide a current signal of a first amplitude on the sending end of the transmission line;

thereafter, detecting a reflected wave signal at the sending end of the transmission line;

in response to detecting the reflected wave signal, turning on a first auxiliary gate circuit connected to the sending end of the transmission line to provide a current signal of a relatively smaller amplitude than the first amplitude at the sending end of the transmission line and turning off the first primary gate circuit.

2. The method in accordance with claim 1 and further comprising the steps of:

receiving a binary input signal of a second logic level in the driver circuit;

in response to the binary input signal of the second logic level turning on a second primary gate circuit connected to the transmission line to provide a current drain of a second amplitude from the transmission line;

subsequently turning on a second auxiliary gate circuit to provide a current drain from the transmission line of a relatively smaller amplitude than the second amplitude and turning off the second primary gate circuit.

3. The method in accordance with claim 2 and further comprising the step of turning off the first auxiliary gate circuit concomitantly with the step of turning on the second auxiliary gate circuit.

4. The method in accordance with claim 2 wherein the step of turning off the first primary gate circuit and the step of turning on the first auxiliary gate circuit are executed in response to detecting a first detection of said change in the voltage level at the sending end of the transmission line.

5. The method in accordance with claim 4 wherein the step of turning off the second primary gate circuit and turning on the second auxiliary gate circuit is excuted in responce to detecting a second change in the voltage level at the sending end of the transmission line.

* * * * *